United States Patent
Melanson et al.

(10) Patent No.: US 7,557,661 B1
(45) Date of Patent: Jul. 7, 2009

(54) DIRECT DIGITAL SYNTHESIS (DDS) HYBRID PHASE-LOCK LOOP FOR LOW-JITTER SYNCHRONIZATION

(75) Inventors: John L. Melanson, Austin, TX (US); Gautham Devendra Kamath, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 133 days.

(21) Appl. No.: 11/618,784

(22) Filed: Dec. 30, 2006

Related U.S. Application Data

(60) Provisional application No. 60/826,757, filed on Sep. 25, 2006.

(51) Int. Cl.
*H03B 1/00* (2006.01)
*H03L 7/06* (2006.01)
*H03D 3/18* (2006.01)

(52) U.S. Cl. .................. 331/1 A; 375/376; 327/129
(58) Field of Classification Search ................ 327/158, 327/149, 129; 375/216, 376; 331/1 A, 18
See application file for complete search history.

(56) References Cited

U.S. PATENT DOCUMENTS

| | | | |
|---|---|---|---|
| 4,636,734 A * | 1/1987 | Genrich | 327/106 |
| 5,521,534 A * | 5/1996 | Elliott | 327/129 |
| 5,786,778 A | 7/1998 | Adams et al. | |
| 5,898,744 A * | 4/1999 | Kimbrow et al. | 375/376 |
| 6,927,642 B2 * | 8/2005 | Hsieh | 331/175 |
| 6,954,114 B2 * | 10/2005 | Schoner | 331/177 R |
| 7,049,852 B2 | 5/2006 | Melanson | |
| 7,092,476 B1 | 8/2006 | Melanson | |
| 7,205,804 B2 * | 4/2007 | Schoner | 327/158 |

FOREIGN PATENT DOCUMENTS

WO    WO9933182 A2    7/1999
WO    WO2004088845 A1    10/2004

OTHER PUBLICATIONS

U.S. Appl. No. 11/232,650, filed Sep. 22, 2005, Melanson.
U.S. Appl. No. 11/082,347, filed Mar. 17, 2005, Jiang et al.
U.S. Appl. No. 11/088,446, filed Mar. 23, 2005, Gudmunson et al.
U.S. Appl. No. 11/082,346, filed Mar. 17, 2005, Gudmunson et al.
U.S. Appl. No. 11/614,368, filed Dec. 21, 2006, Melanson et al.

* cited by examiner

*Primary Examiner*—Joseph Chang
(74) *Attorney, Agent, or Firm*—Andrew M. Harris; Mitch Harris, Atty at Law, LLC

(57) ABSTRACT

A direct digital synthesis (DDS) hybrid phase-lock loop for low-jitter synchronization provides a mechanism for generating a low-jitter clock from a timing reference that has a high jitter level. A DDS circuit provides a clock output and has an input for receiving a rational number. The rational number represents a ratio between the frequency of the clock output and the frequency of another stable clock provided to the circuit. In one implementation, a phase output of the DDS circuit is compared to a phase determined from an incoming timing reference and in another implementation, the low-jitter clock output is utilized to generate a phase number via a counter that is clocked by the clock output and captured by the timing reference.

23 Claims, 7 Drawing Sheets

DIRECT DIGITAL SYNTHESIS (DDS) HYBRID PHASE-LOCK LOOP FOR LOW-JITTER SYNCHRONIZATION

CROSS-REFERENCE TO RELATED APPLICATIONS

This application is related to U.S. provisional application Ser. No. 60/826,757, filed Sep. 25, 2006 and from which it claims benefits under 35 U.S.C. §119(e). This application is also related to co-pending U.S. patent application Ser. No. 11/614,368, entitled "HYBRID ANALOG/DIGITAL PHASE-LOCK LOOP FOR LOW-JITTER SYNCHRONIZATION", filed on Dec. 21, 2006, having at least one common inventor and assigned to the same assignee, which is herein incorporated by reference.

BACKGROUND OF THE INVENTION

1. Field of the Invention

The present invention relates generally to audio/video (AV) systems, and more specifically, to a synchronizing circuit for providing a low-jitter synchronized clock signal.

2. Background of the Invention

Digital audio systems are prevalent in the areas of home entertainment, professional production of multimedia and computer reproduction and generation of multimedia sources. Increasingly, digital audio data is transported from sub-system to sub-system and device to device in both consumer and professional installations and the data is generally provided with, or has embedded, a timing reference that has too much jitter to act as a stable sample clock reference. Furthermore, the timing information may be provided at a frequency that is lower than the clock rate needed to operate a digital audio sink, such as a digital-to-analog converter (DAC) that receives the incoming digital audio data stream.

Therefore, clock generation circuits that provide stable clock references synchronized to a digital audio stream's timing information are frequently required. The clock generating circuits must generally provide a very low-jitter clock from a timing reference that may have a large amount of jitter present and/or from an additional interface clock that also may have a large amount of jitter.

World Intellectual Property Organization (WIPO) International Publication WO2004/088845A1 entitled "METHOD OF ESTABLISHING AN OSCILLATOR SIGNAL", filed by Christopher Julian Travis on Oct. 14, 2004, discloses such clock synchronizing circuits. A clock generated by an analog phase-lock loop (APLL) is synchronized to incoming time information by using a numerically-controlled oscillator that is controlled by a phase-frequency detector that compares the incoming timing information with a division of the output clock to generate an intermediate clock signal. However, the intermediate clock signal frequency places a limit on the performance of the synchronizing circuit, since the intermediate clock signal frequency typically cannot exceed the divided output clock used for phase comparison in the APLL. Furthermore, the effective information update rate in the phase comparator of the APLL is limited to a single bit of information at the intermediate clock signal frequency. The result is that the loop bandwidth of the APLL must be low enough to remove jitter from the intermediate clock signal, but high enough to remove the inherent noise of the APLL's oscillator.

The constraints on the above-described synchronization circuit reduce applicability of the circuit and place limitations on the jitter-reduction performance obtainable for a given application.

Therefore, it would be desirable to provide an improved synchronization circuit and method for generating a low-jitter clock source in synchronization with a jittery timing reference.

SUMMARY OF THE INVENTION

The above stated objectives are achieved in a synchronization circuit and method for generating an output clock signal from a timing reference. The method is a method of operation of the circuit.

The circuit includes a direct digital synthesis (DDS) circuit that provides a clock output and has an input for receiving a rational number. The rational number represents a ratio between the frequency of the clock output and the frequency of another stable clock provided to the circuit. The stable clock is a low-jitter clock source, but generally is asynchronous with the clock output signal. A phase output of the DDS circuit can be compared to a phase number derived from the incoming timing reference. Alternatively, a counter can be used to divide the frequency of the clock output to directly obtain a phase number that can then be compared to an accumulated phase of the stable clock to generate the rational number.

The DDS circuit includes a phase integrator that generates a phase number from the rational number input and the stable clock. The phase integrator output is utilized to address a lookup table or a coordinate rotation digital computer (CORDIC) algorithm that provides values that digitally represent quadrature sinusoidal outputs. The quadrature digital representations are then provided to a circuit that generates analog sine waves, which are then converted to digital form to provide the clock output. The converter circuit may be a band-pass delta-sigma modulator followed by a tunable transconductor/capacitor (Gm-C) band-pass filter that provides a very stable sine wave output.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses direct digital synthesis (DDS) hybrid phase-lock loop (PLL) circuits and methods of operation for providing a low-jitter clock output from a timing reference that may have a large amount of jitter. A digital PLL either includes feedback from at least a part of the DDS circuit, or is utilized to provide a ratiometric frequency control number that is provided to a DDS circuit without any feedback from the DDS circuit. Feedback from the DDS circuit can be either provided from a phase integrator within the DDS circuit, or the frequency and phase of the output of the DDS circuit can be used in the PLL phase comparison. The DSS circuit generates a low jitter clock output in synchronization with a timing reference signal provided to the digital PLL. In one embodiment, an output of the internal phase integrator of the DDS circuit is compared to a phase number generated from the timing reference and the phase comparison result is digitally filtered to provide a ratiometric number that controls the DSS circuit. In another embodiment, feedback may be provided from the clock output and utilized to derive phase information in conjunction with the timing reference, which is then compared to the output of a ratio integrator external to the DSS and provide the input to the digital loop filter.

Figure 1:
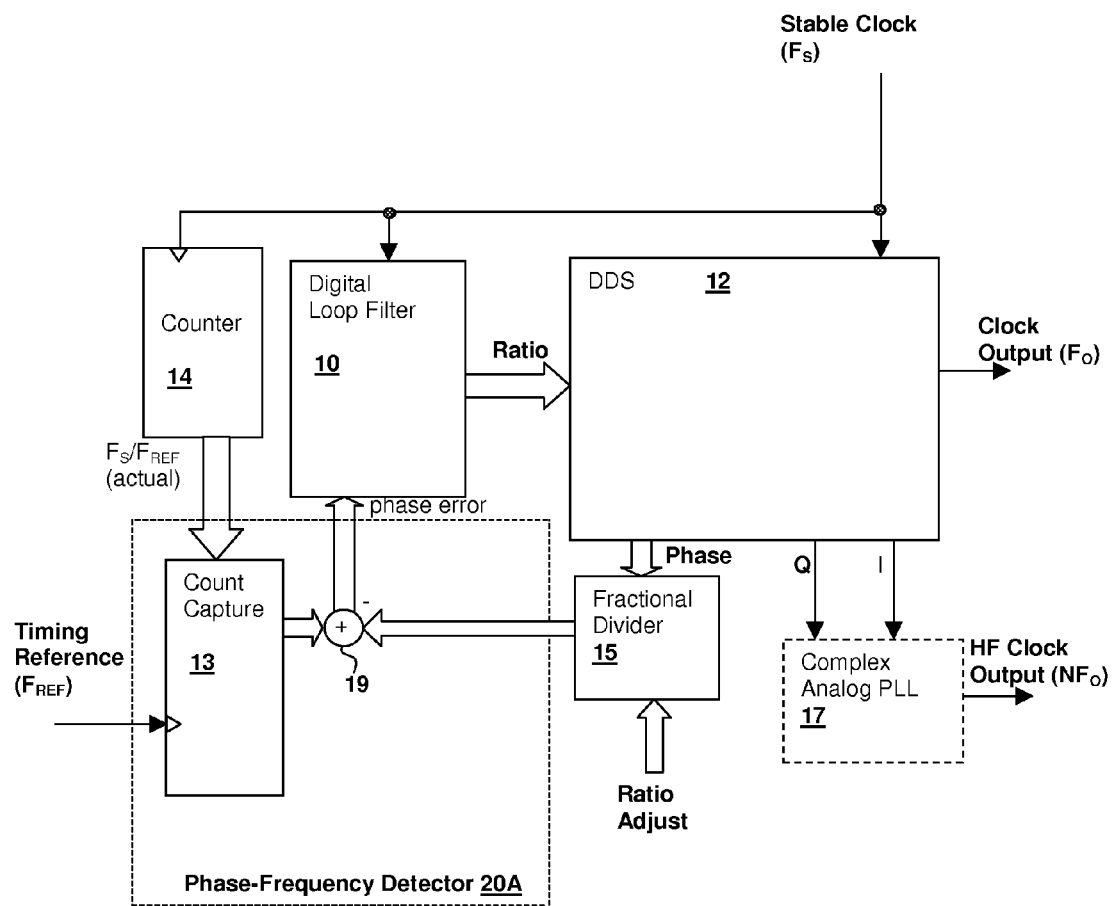
FIG. 1 is a block diagram depicting an exemplary DDS hybrid phase-lock circuit in accordance with an embodiment of the present invention.

Referring now to FIG. 1, an exemplary hybrid DDS PLL circuit in accordance with an embodiment of the invention is shown. A DDS circuit 12 generates a Clock Output signal having a frequency $F_O$ and/or provides a pair of quadrature sinusoidal analog signals that are utilized to provide a reference to a complex analog phase-lock loop (PLL) that multiplies the output frequency of the DDS circuit 12 if a higher-frequency clock output HF Clock Output signal is needed. The exemplary hybrid DDS PLL differs in element structure from a typical analog PLL, but sub-units within both perform similar functions. Rather than using an analog voltage-controlled oscillator (VCO), DDS circuit 12 performs the output signal generation from a numeric value provided from a digital loop filter 10, which performs the same operation of filtering a phase detector output as performed by an analog filter in a typical analog PLL. The phase detector operation is performed by the combination of phase-frequency detector 20A and fractional divider 15, which compare a phase provided from DDS circuit 12 with the phase of a Timing Reference signal to which the Clock Output signal is synchronized by the operation of the circuit of FIG. 1.

Irrespective of the output clock signal generation, in the depicted embodiment, a phase number Phase is provided from the DDS 12 from the internal phase integrator of the DDS 12 and therefore provides a reference phase synchronized with the downstream clock output signals Clock Output and/or HF Clock Output. The Phase number is then provided to fractional divider 15 and the output of fractional divider 15 is introduced to a phase-frequency detector 20A. While a modulo divider, or possibly no divider at all may be used in some applications, inclusion of fractional divider 15 permits any ratio to be specified for generating the phase reference via number Ratio Adjust. The number Ratio Adjust essentially sets the relationship between frequencies $F_O$ and $F_{REF}$, since the adjustment of the Phase output by fractional divider 15 causes a corresponding change in the output of count capture 13. Fractional divider 15 may be a barrel shifter or a combinational divider that scales the Phase output according to Ratio Adjust. Since the phase comparison output of phase-frequency detector 20A is filtered by digital loop filter 10, introduction of a fractional division of the phase number Phase will not render the loop unstable or increase jitter if the bandwidth of digital loop filter 10 is properly designed and/or dynamically controlled.

The other phase reference provided to phase-frequency detector 20A is generated from an external Timing Reference signal having a frequency $F_{REF}$, by a count capture circuit 13 that captures the output of a counter 14. Counter 14 is clocked by a Stable Clock signal having a frequency $F_S$ and thus the count output of counter 14 as captured by the count capture circuit is the integral of the frequency ($F_S$) of the Stable Clock signal over periods of the Timing Reference signal and corresponds to the ratio of $F_S/F_{REF}$. Digital loop filter 10 filters the phase comparator output, which is provided by subtractor 19, to yield the Ratio control number that sets the frequency of DDS circuit 12. Digital loop filter 10 has a bandwidth sufficiently low to remove error due to jitter in the Timing Reference signal so that the Ratio output number from digital loop filter 10, on average, represents the ratio of the frequency $F_S$ of the Stable Clock signal to the frequency $F_O$ of the Clock Output signal.

Figure 2:
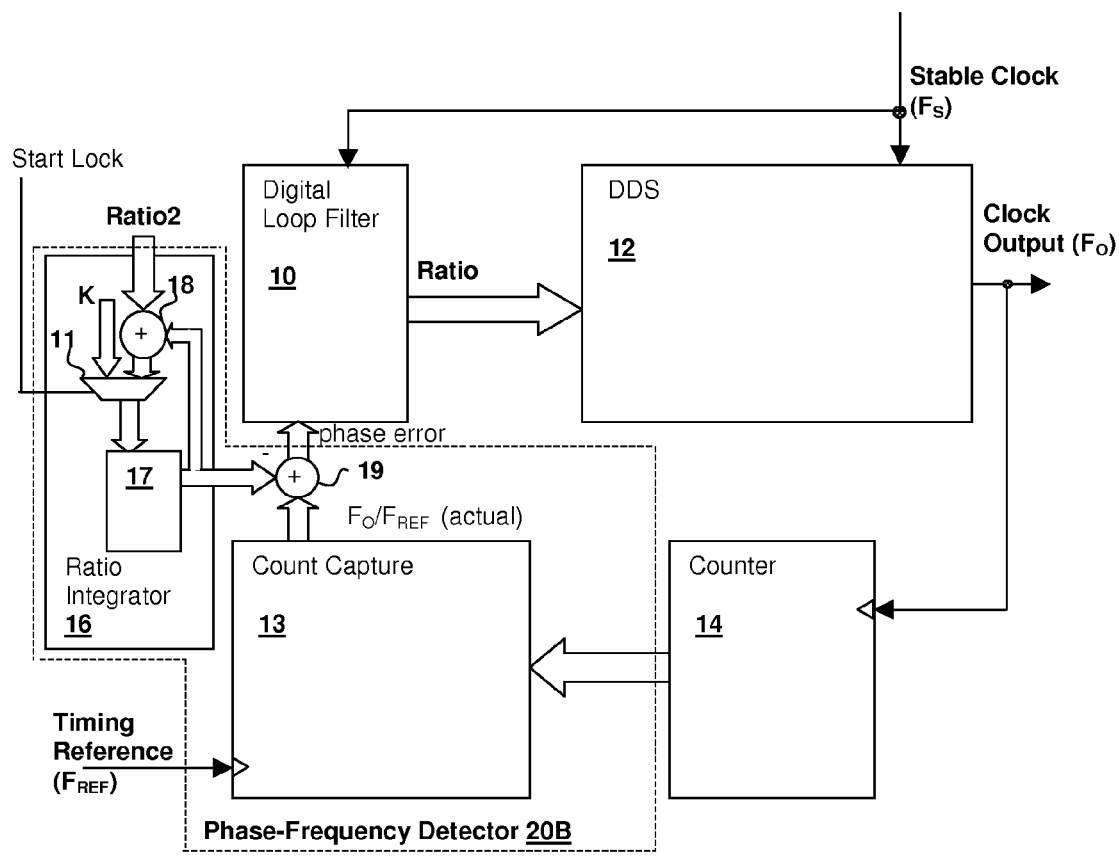
FIG. 2 is a block diagram depicting an exemplary DDS hybrid phase-lock circuit in accordance with another embodiment of the present invention.

Referring now to FIG. 2, an exemplary hybrid DDS PLL circuit in accordance with another embodiment of the invention is shown. The depicted embodiment includes feedback provided from the low-jitter Clock Output signal to the front-end digital phase lock loop. The circuit of FIG. 2 is similar to that of FIG. 1 and therefore only differences between the two circuits will be discussed in detail below. In the depicted embodiment, the phase frequency detector is still implemented by a subtractor 19, but overall a phase-frequency detector 20B in the depicted embodiment differs in structure from that of phase-frequency detector 20A of FIG. 1 and the overall phase detector includes a counter 14, rather than fractional divider 15 as in the circuit of FIG. 1. In phase-frequency detector 20B, the phase inputs are derived in a manner different from that illustrated in the embodiment of FIG. 1. It is understood that either phase comparison strategy may be employed. Phase-frequency detector 20B includes count capture circuit 13 that captures the count output of a counter 14 that divides the Clock Output signal by an integer divisor, rather than the Stable Clock signal as in the circuit of FIG. 1. The count value from a counter 14 is captured at edges of a Timing Reference signal. The captured count value provides a phase number that is the integral of the frequency of the Clock Output signal over periods of the Timing Reference signal and corresponds to the actual ratio of $F_O/F_{REF}$. The circuit of FIG. 2 thereby provides a low-jitter Clock Output signal that is synchronized to the Timing Reference signal.

Subtractor 19 subtracts an expected phase value generated by ratio integrator 16 from the actual phase value from the output of count capture 13 and thus implements a phase comparator. Ratio integrator 16 integrates a ratio control number Ratio2 using a summer 18 and holds the accumulated value in a latch 17 to provide a number that represents an expected on-going accumulated phase count of the divided clock output provided from counter 14 as adjusted by any frequency offset required to generate the desired Clock Output signal frequency $F_O$ from numerically controlled analog oscillator 12. The combination of counter 14, count capture 13, ratio integrator 16, and subtractor 19 can be viewed as a phase comparator that compares a phase determined from the ratio Ratio2 with a phase determined from the Clock Output signal. Modulo arithmetic is employed in summer 18, ratio integrator 16, and subtractor 19, so that overflow of phase accumulation does not cause ambiguities or error. In particular, the bit width of the count output of counter 14 is equal to that of subtractor 19 and ratio integrator 16 and must be sufficiently wide so that counter 14 will not overflow for the lowest possible Timing Reference signal frequency $F_{REF}$ to which the loop will synchronize. A multiplexer 11 selects between the output of summer 18 and a fixed value K that compensates for the delay through count capture circuit 13 and is preloaded into latch 17 by the Start Lock signal to initialize ratio integrator 16 to produce the proper phase relationship between the Timing Reference signal and the count output of counter 14.

Figure 3:
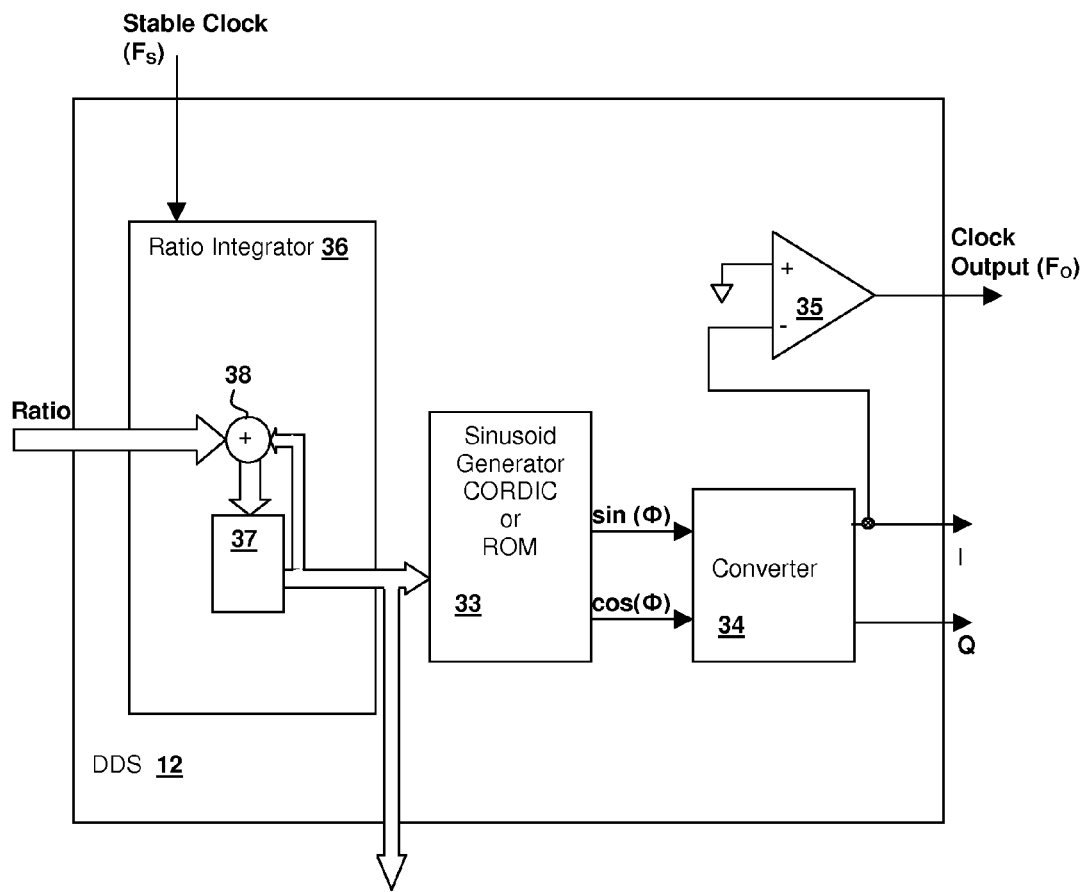
FIG. 3 is a block diagram depicting details of an exemplary DDS circuit 12 that may be used in the circuits of FIG. 1 and FIG. 2.

Referring now to FIG. 3, details of DDS circuit 12 in the circuits of FIG. 1 and FIG. 2 is shown in accordance with an embodiment of the present invention. The circuit of FIG. 3 provides a low-jitter Clock Output signal that has a frequency determined by an input Ratio number and the frequency of the Stable Clock signal. A ratio integrator 36 formed by a latch 37 and adder 38 integrates the Ratio number to provide an ongoing phase number that is used by sinusoidal generating circuit 33 to provide values corresponding to sinusoidal waveshapes ($e^{j\Phi}$), so that as the output phase $\Phi$ from ratio integrator 16 progresses, values corresponding to $\sin(\Phi)$ and $\cos(\Phi)$ are provided from ROM 33 to a converter circuit 34 that provides sinusoidal analog signals I and Q at frequency $F_O$. As mentioned above, the I and Q signals may be further frequency-multiplied by a complex PLL to obtain a higher frequency output clock and/or converted to digital form via a comparator 35 or other suitable analog-to-digital converter to provide a digital Clock Output signal. Sinusoid generating circuit 33 either calculates sinusoidal representation values via a CORDIC algorithm or indexes a read-only memory (ROM) using the input phase information. Use of a CORDIC algorithm processing block provides a compact implementation, as the ROM size required for look-up table implementation increases exponentially with an increase in the resolution of the phase value used as a look-up address.

Figure 4:
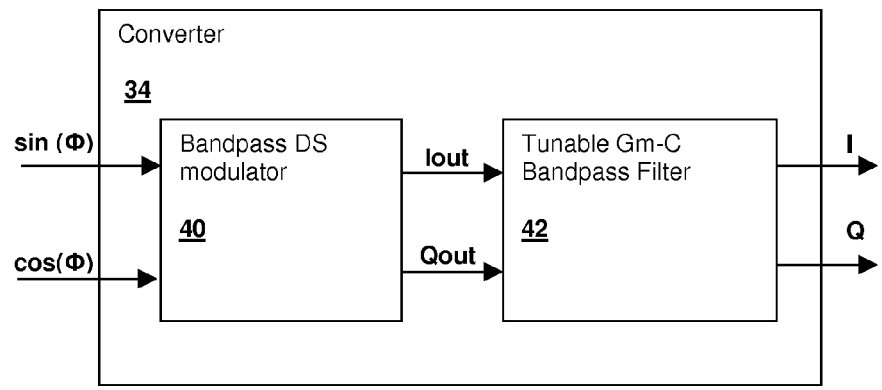
FIG. 4 is a block diagram depicting details of converter 34 of FIG. 3.

Referring now to FIG. 4, details of converter circuit 34 are shown in accordance with an embodiment of the present invention. Band-pass delta-sigma modulator 40 receives the values corresponding to $\sin(\Phi)$ and $\cos(\Phi)$ provided from sinusoidal signal generating block 33 and generates a multi-leveled highly quantized representation of $\sin(\Phi)$ and $\cos(\Phi)$, for example a tri-state representation having values according to the set [−1,0,+1]. A tunable Gm-C band-pass filter 42 then filters the multi-leveled representation to obtain the I and Q analog quadrature sinusoids. The tunability of band-pass filter is provided to track the output frequency $F_O$ of DDS 12 so that the passband is centered around $F_O$ as $F_O$ is varied by the input number Ratio.

Figure 5:
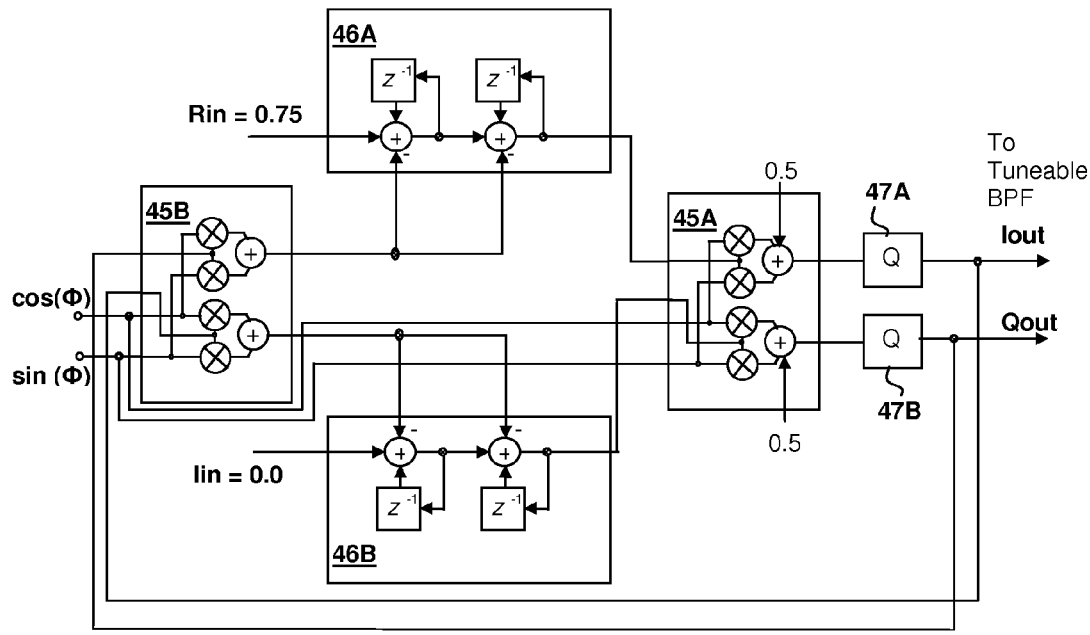
FIG. 5 is a schematic diagram depicting details of band-pass delta-sigma modulator 40 of FIG. 4.

Referring now to FIG. 5, details of band-pass delta-sigma modulator 40 are shown in accordance with an embodiment of the present invention. A pair of modulators 45A and 45B modulate the input $\sin(\Phi)$ and $\cos(\Phi)$ signals provided from ROM 33 to and from baseband DC (zero frequency), so that a pair of noise-shaping low-pass filters 46A and 46B can remove any tones that deviate from frequency $F_O$ by the noise-shaping action of the modulator loop. A pair of quantizers 47A and 47B provide the multi-level Iout and Qout noise-shaped sinusoidal values. The output summers of modulator 45A are provided with a DC bias of 0.5 Volts and the input to noise-shaping low-pass filters 46A and 46B are provided with DC offsets chosen for example as 0.75 and 0.0 Volts, respectively, so that the operating amplitudes at the outputs of modulators 45A and 45B have significant amplitude, but not so high as to saturate the circuit. The outputs of band-pass delta-sigma modulator 40 are therefore Iout and Qout signals that are noise-shaped to remove any tones or noise near frequency $F_O$. The Iout and Qout signals are then provided to tunable Gm-C filter 42 to remove the modulator artifacts produced by the noise-shaping process and images at multiples of the stable clock frequency $F_S$, to yield pure sinusoidal signals I and Q.

Figure 6:
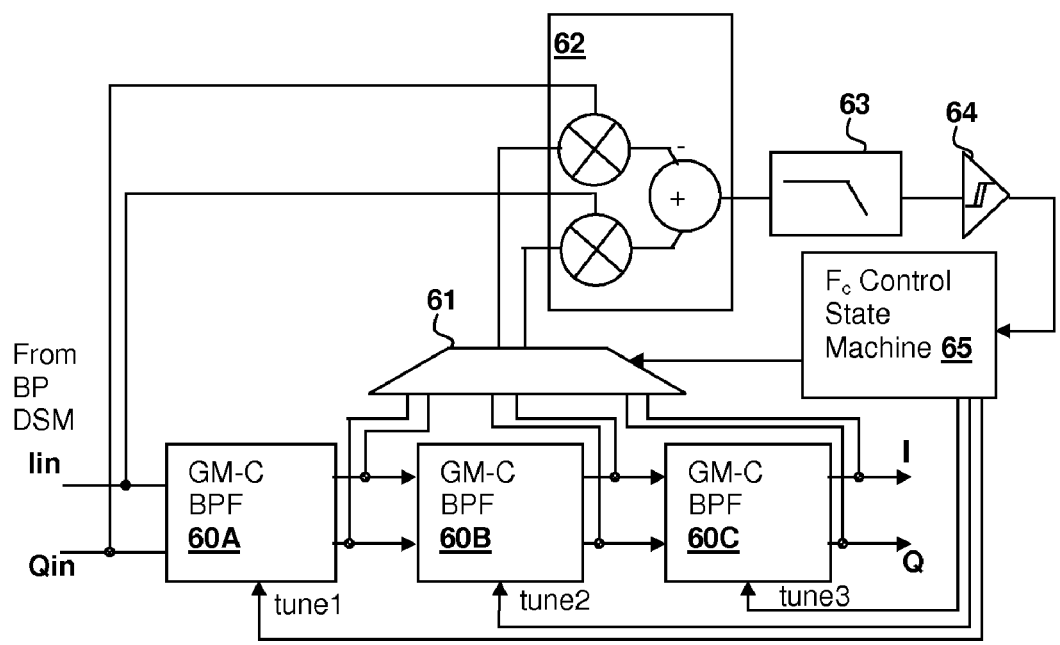
FIG. 6 is a block diagram depicting details of tunable Gm-C band-pass filter 42 of FIG. 4.

Referring now to FIG. 6, details of tunable Gm-C filter 42 in accordance with an embodiment of the present invention are shown. Three Gm-C band-pass filter stages 60A-60C are provided that successively filter Iin and Qin signals provided from the Iout and Qout signals, respectively, of band-pass delta-sigma modulator 40 to produce the final I and Q signals output from DDS 12. A multiplexer 61 selects from among the outputs of filter stages 60A-60C to provide an input to a modulator 62 that tunes the center frequency of filter stages 60A-60C via corresponding filter tune signals tune1-tune3. A low pass filter 63 and hysteresis comparator 64 provide signal detection so that a center-frequency control state machine 65 can determine when the outputs of each stage, as selected by multiplexer 61 and as controlled by center-frequency control state machine 65, are maximized, indicating that each filter stage 60A-60C is properly centered around frequency $F_O$.

Figure 7:
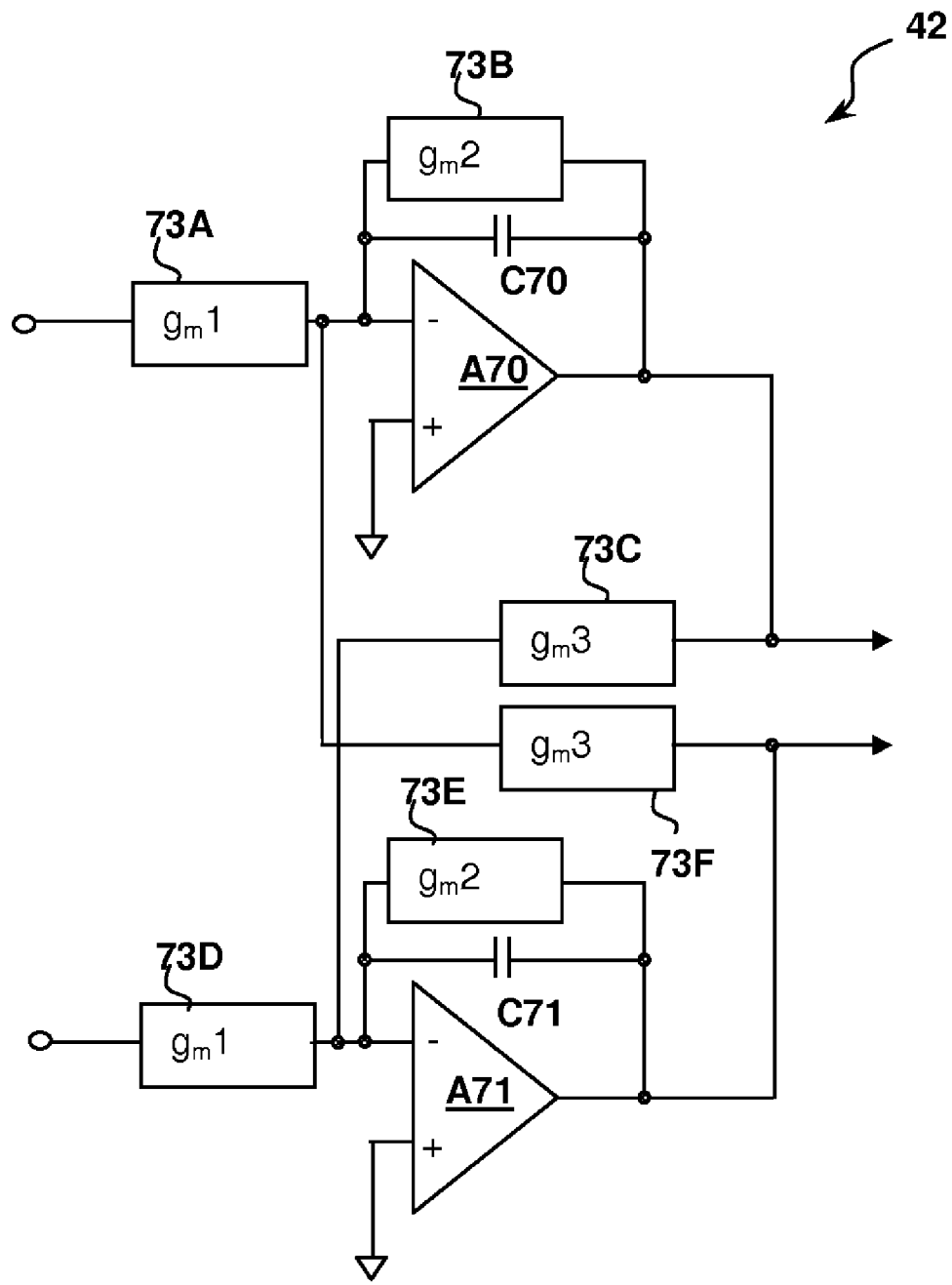
FIG. 7 is a schematic diagram depicting details of Gm-C filter stages 60A-60C of FIG. 6.

Referring now to FIG. 7, details of filter stages 60A-60C are shown in accordance with an embodiment of the present invention. A pair of op-amps A70 and A71 implement a quadrature band-pass filter via zeros at frequency $F_O$ set by capacitors C70, C71 and transconductors 73B, 73E, which have identical values for each filter half. The DC gain of each filter half is set also by transconductors 73A and 73D. Transconductors 73B, 73E have values set by the appropriate tune1-tune3 signals and the values of transconductors 73A and 73D are set to keep the gain constant when the value of transconductors 73B, 73E is varied, i.e, an inverse control relationship is maintained so that the ratio of transconductance $g_m2/g_m1$ is kept constant. Transconductors 73C, 73F provide out-of-phase feedback of low frequency information, so that a DC pole is introduced in each filter half to transform the filter halves from low-pass to band-pass. Since the outputs of amplifiers A70 and A71 have 45 degree lag at frequency $F_O$, the feedback at frequency $F_O$ provided through transconductors 73C, 73F combined with the additional 45 degree lag of the other filter half causes the feedback contribution to act in-phase at frequency $F_O$ providing the band-pass action of the filter.

Figure 8A:
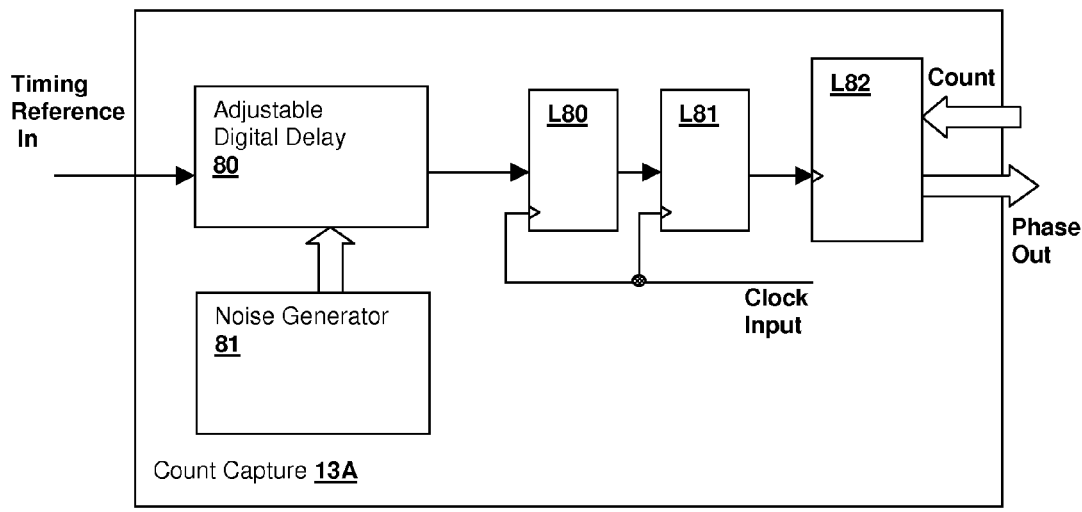
FIGS. 8A-8B are schematic diagrams of count capture circuits that may be utilized to implement count capture circuit in the circuits of FIG. 1 and FIG. 2.

Referring now to FIG. 8A, a count capture circuit 13A that can be used to implement count capture circuit 13 of FIGS. 1-2 is illustrated. Due to the sampling of the output of counter 14 by the edges of the Timing Reference signal, jitter tones can be generated by the sampling action. Dithering is applied to effectively remove the jitter tones by spreading their energy across a broad frequency range. In the depicted embodiment, an adjustable digital delay 80, which may be a shift register with a tap selector, is controlled by a noise generator 81 that varies the delay pseudo-randomly. The output of adjustable digital delay 80 is stabilized by a pair of latches L80 and L81, which are clocked by a Clock Input signal. The Clock Input signal is provided from the Clock Output signal in the embodiment of FIG. 1 or the Stable Clock signal in the embodiment of FIG. 2. A third latch L82 is clocked by the dithered Timing Reference signal and captures the Count output of counter 14 to generate the phase number output of count capture circuit 13.

Figure 8B:
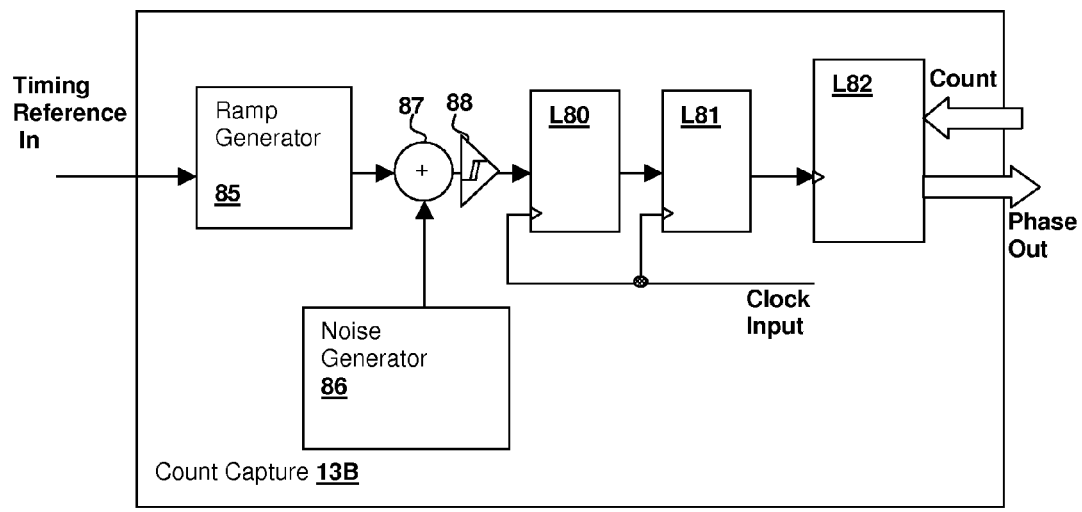

Referring now to FIG. 8B, a count capture circuit 13B that can alternatively be used to implement count capture circuit 13 of FIGS. 1-2 is illustrated. An analog ramp generator 85 is triggered by edges of the Timing Reference signal and the output of ramp generator 85 is summed with the output of an analog noise generator 86 by a summer 87. A hysteresis comparator 88 compares the output of summer 87 with a threshold to generate the input to latch L80. The balance of the circuit operates as described above with respect to FIG. 8A.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A circuit for providing a low-jitter clock output synchronized to a timing reference having jitter, said circuit comprising:
    a numerically-controlled signal source for providing said clock output and having an input for receiving a rational numeric representation of a ratio between a frequency of said clock output and a frequency of a stable clock for controlling said frequency of said clock output, wherein said numerically-controlled signal source generates at least one substantially sinusoidal analog signal in conformity with said rational numeric representation and said stable clock, and converts said at least one substantially sinusoidal signal to a digital representation to produce said clock output;
    a counter for dividing a frequency of one of said stable clock or an output of said numerically-controlled signal source;
    a digital phase-frequency detector for generating a representation of an on-going phase-frequency difference between said timing reference and an output of said counter; and
    a digital loop filter for filtering said representation of said on-going phase-frequency difference to provide said rational numeric representation to said numerically-controlled signal source.

2. The circuit of claim 1, wherein said numerically-controlled signal source includes a phase integrator for integrating said rational numeric representation to generate an indication of a phase of said at least one substantially sinusoidal analog signal, wherein said counter divides a frequency of said stable clock to determine a reference phase number in conformity with a frequency of said timing reference, and wherein said digital phase-frequency detector compares said reference phase number and said indication of phase.

3. The circuit of claim 2, further comprising a divider for dividing said indication of said phase prior to comparison by said digital phase-frequency detector.

4. The circuit of claim 3, wherein said divider is an adjustable fractional divider, whereby a frequency relationship between said at least one substantially sinusoidal analog signal and said reference phase number can be set to an arbitrary rational relationship.

5. The circuit of claim 1, wherein said counter divides said frequency of said output of said numerically-controlled signal source, wherein said counter provides phase-frequency feedback from said clock output of said numerically-controlled signal source, whereby said numerically-controlled signal source is controlled by said feedback.

6. The circuit of claim 1, wherein said numerically-controlled signal source comprises:
    a phase integrator for integrating said rational numeric representation at each period of said stable clock to generate a phase index;
    a sinusoid generating circuit for providing a digital representation of at least one substantially sinusoidal analog signal in response to said phase index;
    a conversion circuit for converting said digital representation of said at least one substantially sinusoidal analog signal to said at least one substantially sinusoidal analog signal; and
    an analog-to-digital clock conversion circuit for converting an output of said conversion circuit to said clock output.

7. The circuit of claim 6, wherein said sinusoid generating circuit is a CORDIC algorithm processing block for calculating values of said digital representation of said at least one substantially sinusoidal analog signal in conformity with said phase index.

8. The circuit of claim 6, wherein said sinusoid generating circuit is a read-only-memory providing a look-up table, wherein said read-only-memory provides a digital representation of said at least one substantially sinusoidal analog signal in response to an address specified by said phase index.

9. The circuit of claim 6, wherein said at least one analog signals is a pair of quadrature analog signals, wherein said read-only-memory provides a pair of digital representations of said pair of quadrature analog signals.

10. The circuit of claim 6, wherein said analog-to-digital clock conversion circuit comprises a comparator for directly converting said at least one analog signal to said clock output.

11. The circuit of claim 6, wherein said analog-to-digital clock conversion circuit comprises a delta-sigma band-pass modulator for providing at least one noise-shaped multi-level output from said digital representation of said at least one substantially sinusoidal analog signal.

12. The circuit of claim 11, wherein said analog-to-digital clock conversion circuit further comprises a tunable band-pass filter for filtering said at least one noise-shaped multi-level output to provide said at least one substantially sinusoidal analog signal.

13. The circuit of claim 12, wherein said tunable band-pass filter comprises a transconductor-capacitor tuned filter having a center frequency set by a variable transconductance.

14. The circuit of claim 1, wherein said digital phase-frequency detector comprises a latch for capturing a count of said counter at edges of said timing reference.

15. The system of claim 14, further comprising a summing circuit for summing said captured count with a frequency ratio control number, whereby a desired rational numeric relationship between said frequency of said clock output and a frequency of said timing reference is adjustable.

16. A method of providing a low-jitter clock signal synchronized to a timing reference having jitter, said method comprising:
    generating a clock output from a numerically-controlled signal source ratiometrically locked to a stable clock source, wherein a frequency of said clock output is controlled by a rational numeric representation of a ratio between a frequency of said clock output and a frequency of said stable clock, and wherein said generating generates at least one substantially sinusoidal analog signal in conformity with said rational numeric representation and said stable clock source, and converts said at least one substantially sinusoidal signal to a digital representation to produce said clock output;
    dividing a frequency of one of said clock output or said stable clock;
    generating a representation of an on-going phase-frequency difference between said timing reference and a result of said dividing; and
    filtering said representation of said on-going phase-frequency difference with a digital filter to provide said rational numeric representation to said numerically-controlled analog oscillator.

17. The method of claim 16, wherein said generating said at least one substantially sinusoidal signal comprises:

generating a phase from said rational numeric representation by integrating said rational numeric representation in conformity with periods of said stable clock source; and calculating representations of sinusoidal waveforms from said generated phase to generate a digital representation of said at least one substantially sinusoidal signal.

18. The method of claim 16, wherein said generating said at least one substantially sinusoidal signal comprises:

generating a phase from said rational numeric representation by integrating said rational numeric representation in conformity with periods of said stable clock source; and retrieving representations of sinusoidal waveforms from storage in conformity with said generated phase to generate a digital representation of said at least one substantially sinusoidal signal.

19. The method of claim 18, further comprising noise-shaping said digital representation of said at least one substantially sinusoidal signal to provide at least one multi-level noise-shaped output signal.

20. The method of claim 18, further comprising filtering said at least one multi-level noise-shaped output signal with a tunable band-pass filter.

21. The method of claim 20, further comprising tuning said band-pass filter to a frequency of said clock output by adjusting a transconductance value in said tunable band-pass filter.

22. A circuit for providing a low-jitter clock output synchronized to a timing reference having jitter, said circuit comprising:

a phase measurement circuit for determining a phase of said timing reference;

a phase integrator for integrating a rational numeric representation of a ratio between a frequency of a stable clock and a frequency of said clock output;

a sinusoidal signal generating circuit for providing a pair of quadrature digital sinusoidal signal representations in conformity with a phase output of said phase integrator;

a converter circuit for converting said pair of quadrature digital sinusoidal signal representations to a pair of quadrature analog sinusoidal signals;

a comparator for generating said clock output from one of said analog sinusoidal signals;

a phase-frequency detector for comparing said output of said phase integrator and said phase of said timing reference; and a digital loop filter for filtering an output of said phase-frequency detector to provide said rational numeric representation.

23. The circuit of claim 22, wherein said converter circuit comprises:

a delta-sigma band-pass modulator for noise-shaping said pair of quadrature digital sinusoidal signal representations; and a tunable band-pass filter for filtering an output of said delta-sigma band-pass modulator to provide said a pair of quadrature analog sinusoidal signals.

* * * * *